United States Patent [19]

Roche

[11] Patent Number: 4,581,248

[45] Date of Patent: Apr. 8, 1986

[54] APPARATUS AND METHOD FOR LASER-INDUCED CHEMICAL VAPOR DEPOSITION

[76] Inventor: Gregory A. Roche, 4287 Drybed Ct., Santa Clara, Calif. 95054

[21] Appl. No.: 587,284

[22] Filed: Mar. 7, 1984

[51] Int. Cl.⁴ .............................................. B05D 3/06
[52] U.S. Cl. ................................... 427/53.1; 118/620; 118/641; 118/725; 427/55
[58] Field of Search .......................... 427/53.1, 93, 55; 118/725, 620, 641

[56] References Cited

U.S. PATENT DOCUMENTS

| | | | |
|---|---|---|---|
| 3,271,180 | 9/1966 | White | 117/38 |
| 3,364,087 | 1/1968 | Solomon et al. | 156/4 |
| 3,661,637 | 5/1972 | Sirtl | 427/55 |
| 3,761,677 | 9/1973 | Mitzutani | 219/349 |
| 4,059,461 | 11/1977 | Fan et al. | 148/1.5 |
| 4,260,649 | 4/1981 | Dension et al. | 427/53.1 |
| 4,340,617 | 7/1982 | Devtsch et al. | 427/53.1 |
| 4,343,829 | 8/1982 | Tochikubo et al. | 427/35 |
| 4,363,828 | 12/1982 | Brodsky et al. | 427/86 |
| 4,371,587 | 2/1983 | Peters | 428/446 |
| 4,421,479 | 12/1983 | Muka et al. | 432/31 |

OTHER PUBLICATIONS

Boyer et al., "Microelectronic Thin Film Deposition by UV Laser Photolysis" *Proc. Soc. of Photo-Instrumentation Eng.*, Jan. 1983.
*Semiconductor International*, Sep. 1983, pp. 17, 18.
Boyer et al., *App. Phys. Lett.*, vol. 40, No. 8, Apr. 1982, pp. 716–719.
Industrial Chemical Industries Ltd. "Notes on Drying Paints by Radiant Heat", pp. 12–14.

*Primary Examiner*—John H. Newsome
*Attorney, Agent, or Firm*—Ellsworth R. Roston; Charles H. Schwartz; Thomas R. Fitzgerald

[57] ABSTRACT

This invention relates to apparatus and methods for laser induced vapor deposition upon a substrate. The invention includes apparatus isolated from the deposition chamber for preheating the substrate before deposition. A bellows arrangement permits adjustment of the heat applied to the substrate.

34 Claims, 5 Drawing Figures

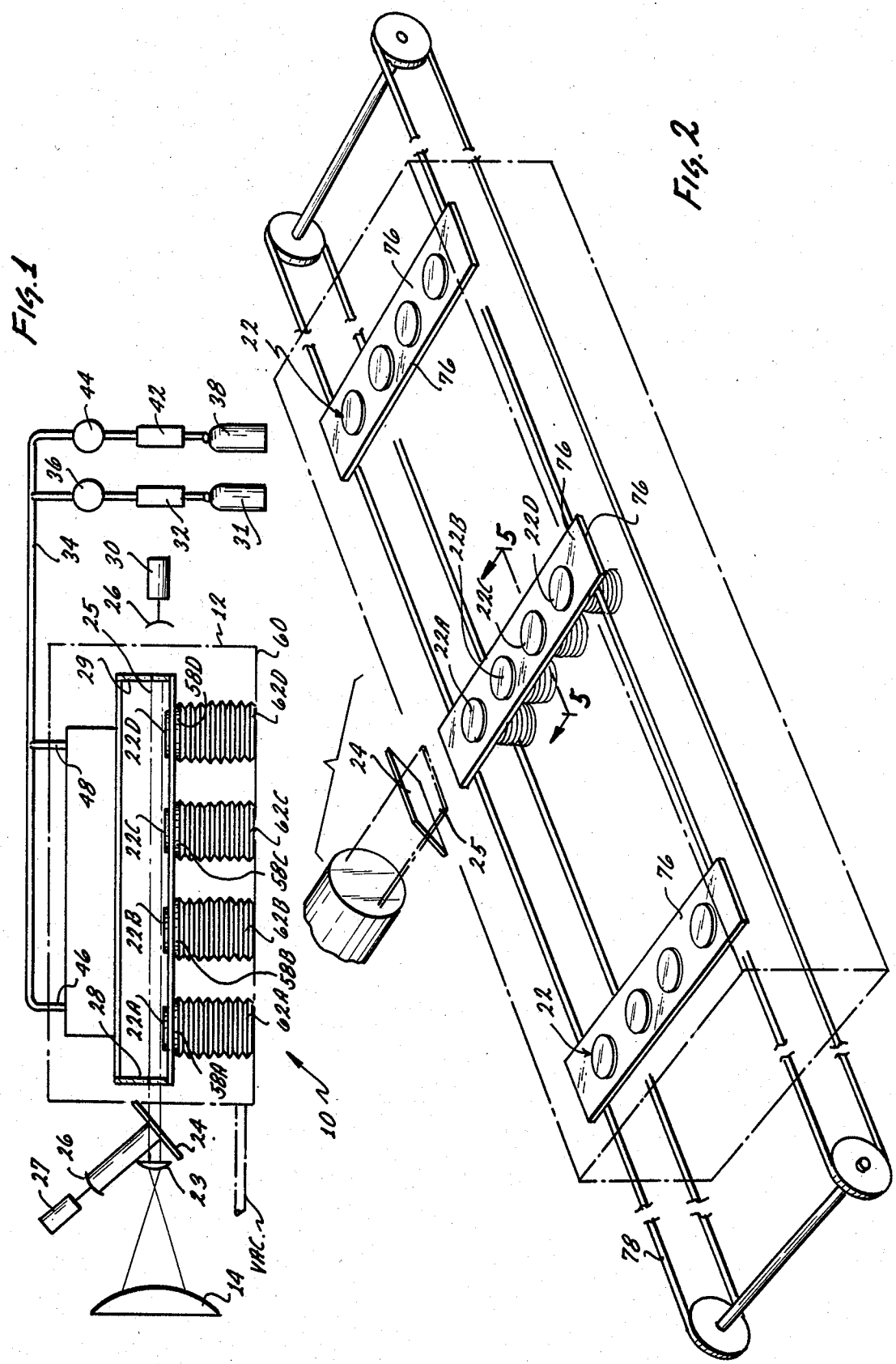

APPARATUS AND METHOD FOR LASER-INDUCED CHEMICAL VAPOR DEPOSITION

BACKGROUND OF THE INVENTION

This invention relates generally to vapor deposition apparatus and methods for producing doped semi-conductors and particularly to the deposition of silicon dioxide films on silicon wafers. Still more particularly, this invention relates to rapid, relatively low temperature vapor deposition of silicon dioxide films on silicon wafers while eliminating unwanted deposition of the silicon dioxide film in the deposition chamber.

There is considerable interest in low-temperature techniques for depositing silicon dioxide films on silicon substrates to reduce dopant redistribution, wafer warpage, defect generation and to provide an insulator which requires no high-temperature steps for double level metallization. Deposition at low temperature also permits the use of layered photoresist-silicon dioxide-photoresist structures for high resolution lithography. Atmospheric chemical vapor deposition and low temperature low pressure chemical vapor deposition techniques, while reducing process temperatures, are deficient in uniformity, purity and film stability.

Plasma enhanced chemical vapor deposition techniques have made low temperature deposition temperature possible with improved physical characteristics, but plasma techniques are not always non-destructive, especially for radiation sensitive metal-oxide-semiconductor (MOS) devices. In plasma assisted chemical vapor deposition the substrate is bombarded with energetic neutral particles, charged particles and vacuum ultraviolet (VUV) photons, all of which contribute to chemical and physical damage to the substrate, the interface and the growing film. Another disadvantage of plasma deposited films is that the plasma potential is always more positive than the walls of the deposition chamber. Therefore, ions are accelerated by sheaths at the walls, thereby enhancing impurity sputtering and flaking, both of which degrade film quality. Plasma process parameters such as radio frequency power, radio frequency, gas flow, electrode spacing, total pressure, and substrate temperature are so interrelated that it is impossible to characterize and control defects due to a single parameter.

Because of the difficulties associated with atmospheric chemical vapor deposition, low temperature chemical vapor deposition and plasma enhanced chemical vapor deposition techniques, interest in photochemically deposited insulating films in which the reaction energy is selectively provided by photons has increased considerably. Previous workers have used both mercury photosensitized reactions and direct photolytic reactions to deposit silicon dioxide at low temperatures. Mercury lamps provide incoherent ultraviolet strong photons and vacuum ultraviolet weak photons to liberate atomic oxygen from molecular donor molecules by photodissociation. The use of mercury lamps causes the entire illuminated volume of gas to react to form products, Unwanted deposition and loss of reactants on reactor walls may be considerable and deposition rates are low. The best mercury sensitized deposition rate is just under the 200 Å/min. The limitation of deposition rate is attributed to loss of atomic oxygen by recombination on surfaces of the reactor vessel.

High deposition rate is of concern in economical production processes and can ultimately determine film purity, given the background pressure of impurities and the desired film thickness. Therefore, there is a need in the art for new methods of film deposition, which improve the characteristics of inter-layer dielectrics, such as step coverage, uniformity, film integrity, speed of deposition and elimination of unwanted deposition and loss of reactants on reactor walls.

SUMMARY OF THE INVENTION

This invention overcomes the difficulties associated with previous apparatus and methods for vapor deposition of producing doped semi-conductors. The invention is particularly suitable for vapor deposition of silicon dioxide films on silicon wafers.

The present invention includes a vapor deposition chamber including means for connection to an oxygen donor and a silicon donor. A coherent light source provides an optical beam that is input to the vapor deposition chamber through a window. A boat placed in position by a conveyor or other suitable means, carries at least one and preferably a plurality of wafers into the vapor deposition chamber for alignment into the optical beam, which is preferably formed as a sheet of light that extends over an area approximately to the surface area of the boat and wafers. The wafers are mounted at their edges in alignment with openings in the boat. The openings are aligned with a suitable source of infrared radiation, such as a halogen lamp when the wafers are aligned with the optical beam from the coherent light source. The infrared radiation source heats the wafers to a temperature appropriate for vapor deposition within a few seconds after the wafers are properly positioned for vapor deposition within the deposition chamber. A window between the infrared light source and the wafers maintains the infrared light source in isolation from the wafers and donor gases supplied to the vapor deposition chamber. The infrared light source may further include a reflector, such as a parabolic mirror for forming a uniform beam of infrared radiation for incidence upon the wafers through the windows. The windows are preferably mounted on bellows that include means for adjusting the distance between the windows and the wafers.

The present invention provides significant advantages over previous apparatus and methods for vapor deposition. Heating the wafers prior to deposition with the infrared light source permits heating the wafers to the proper temperature for vapor deposition in a few seconds whereas typically prior art devices and methods require as much as six minutes to heat the wafers to the deposition temperature. It is well known that in a laser induced vapor deposition system, deposition occurs on surfaces that are at optimal temperatures to enhance the deposition. Prior art apparatus and methods for vapor deposition typically heat the walls of the vapor deposition chamber while heating the wafers so that a significant amount of deposition occurs on the walls of the chamber. The present invention rapidly heats the wafers to the deposition temperature and deposition proceeds without significant deposition upon the chamber walls. Having the infrared heat source isolated from the wafers insures that the infrared light sources experience no vapor deposition, which would drastically reduce the effectiveness of the infrared light sources as means for heating the wafers prior to vapor deposition.

BRIEF DESCRIPTION OF THE DRAWINGS

FIG. 1 is a schematic representation of the apparatus used in the vapor deposition process;

FIG. 2 is a perspective view of the vapor deposition chamber of FIG. 1;

DESCRIPTION OF THE PREFERRED EMBODIMENT

Figure 3:
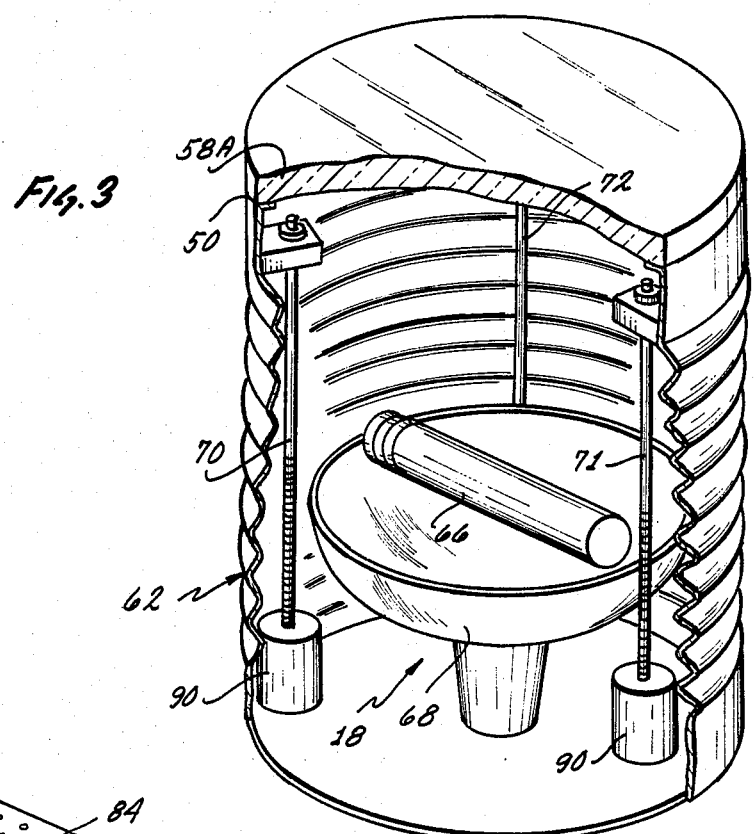
FIG. 3 is an enlarged perspective view of a bellows including in the vapor deposition chamber for adjusting the position of a quartz window relative to a wafer.

Referring to FIGS. 1 and 3, a vapor deposition apparatus 10 according to the invention includes a vapor deposition chamber 12, a coherent light source 14, a bellows apparatus 62, and a radiant heat source 18.

The coherent light source 14 may be any commercially available laser that produces light of a wavelength suitable for initiating vapor deposition upon a wafer 22 positioned within the vapor deposition chamber 12. One suitable laser is a Lumonics 860T Excimer Laser operated on the 193 nm ArF line to form a rectangular beam. A cylindrical lens telescope 23 focuses the rectangular beam onto a beam splitter 24 that transmits most of the light incident thereon and reflects a selected portion, which may be 2–5%, onto a photodetector 26. The output of the photodetector 26 is proportional to the power of the output beam of the coherent light source 14 and is input to a power meter 27 for monitoring the power output of the coherent light source 14.

The beam transmitted through the beam splitter 24 provides a sheet 25 of photons that are incident upon a window 28 chosen to be essentially transparent to the wavelength output by the coherent light source 14. The window 28 may be conveniently formed of an ultraviolet transmissive quartz or similar substance. The wafer, or substrate, 22 is mounted in the vapor deposition chamber 12 so that the sheet of photons is parallel to the wafer 22 and a controlled distance therefrom. The distance between the wafer 22 and the sheet of photons is preferably less than 1 mm and is typically about 0.3 mm. After propagating past the wafer 22, the optical beam exits from the vapor deposition chamber 12 through a second window 29, similar to the window 28 and is incident upon a second power meter 30. The ratio of the power output of the coherent light source 14 to power incident upon the power meter 30 is indicative of the optical power used in the deposition process.

A gas tank 31 provides an oxygen donor to the vapor deposition chamber 12 through a metering device 32 and a manifold 34 under control of a valve 36. A similar tank 38 provides gaseous silicon donor through a metering device 42 and the manifold 34 under control of a valve 44. The oxygen and silicon donors may conveniently be $N_2O$ and 5% silane, $SiH_4$, in nitrogen. The silicon and oxygen donors mix in the manifold 34 and may be input to the vapor deposition chamber 12 at a pair of inlets 46, 48.

Referring to FIGS. 1, 2 and 3, the vapor deposition apparatus 10 includes at least one and preferably a plurality of glass plates 58A, 58B 58C 58D, that are preferably formed of a substance such as quartz, which is transmissive to infrared radiation, mounted in the vapor deposition chamber 12 on a plurality of corresponding bellows members 62A, 62B, etc. that are connected to a lower wall 60 of the vapor deposition chamber 12. Vacuum-tight seals 50 seal the junctions of the bellows 62A, 62B, etc. to the quartz plates 58A, 58B, etc. Each bellows contains a corresponding halogen lamp 66 which outputs infrared radiation. A plurality of reflectors 68 which are preferably parabolic, reflect the output of the halogen lamps 66 to provide substantially uniform radiation to the plates 58A, 58B, etc., which may, for example, be 4–6 inches in diameter. A plurality of rods 70–72 connected to the bellows 62 permit adjustment of the height and angle of the plate 58 relative to the wafer 22. The halogen lamp 66 and the reflector 68 thus provide heat to a wafer 22 positioned above the plate 58.

The coherent light source 14 produces a beam that results in the sheet of photons described above extending through the housing 12 just above the plates 58A, 58B, etc.

Figure 4:
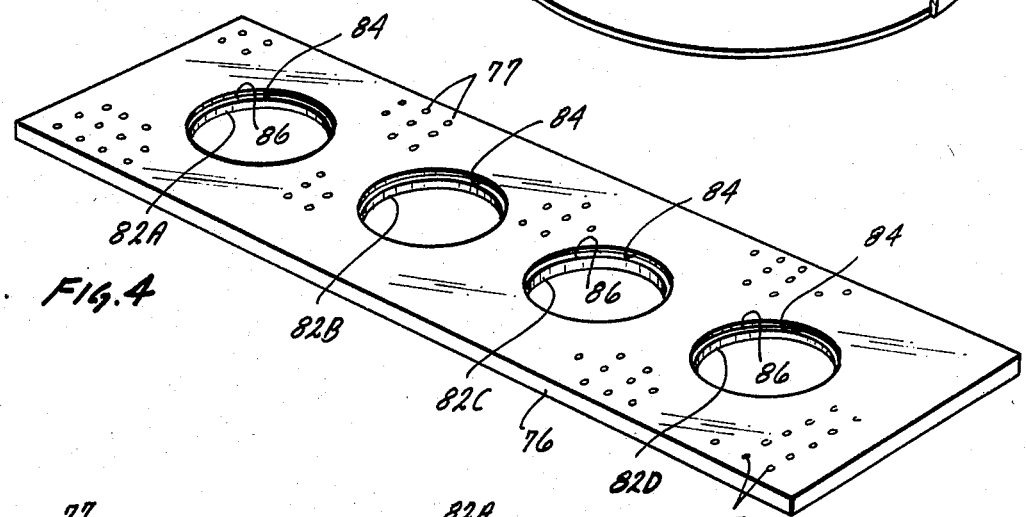
FIG. 4 is a perspective view of a boat used to carry wafers into the vapor deposition chamber.
Figure 5:
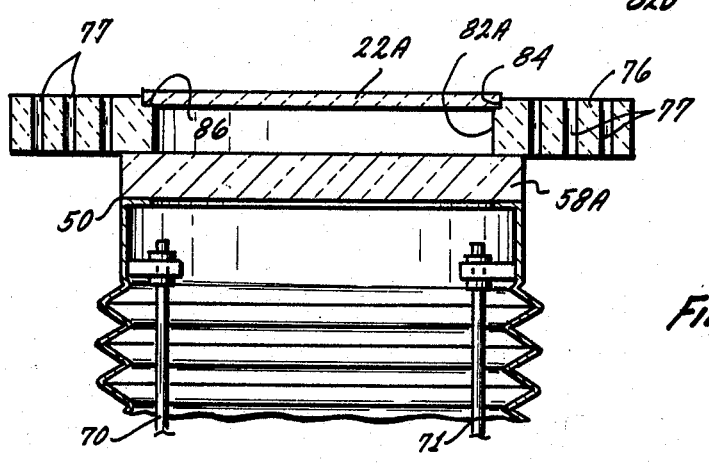
FIG. 5 is a cross section of the boat of FIG. 4 showing a wafer and bellows.

Referring to FIGS. 1, 2 and 4, a boat 76 having wafers 22A, 22B, etc. mounted thereon is moved by any convenient means such as a conveyor chain or belt 78 so that the wafers 22A, 22B, etc. are positioned in alignment with the halogen lamps 66A, 66B, etc. The boat 76 and conveyor 78 (not shown) position the wafers 22A, 22B, etc. in the vapor deposition chamber 12 in alignment with the corresponding quartz plates 58A, 58B, etc. The boat 76 includes at least one and preferably a plurality of generally circular openings 82A, 82B, etc. formed therein smaller in diameter than the wafers 22. Each of the circular openings 82A, 82B, etc. includes a notch 84 that forms a shoulder 86 for supporting the wafers 22A, 22B, etc. The diameter of the circle formed by the notch 84 is slightly larger than that of the wafers 22A, 22B, etc. so that they may be easily inserted into and removed from the boat 76. The boat 76 has a multiplicity of passages 77 therethrough so that the donor gases pass through the boat 76 to continuously supply the substances being deposited to the wafers.

The lower surface of the boat 76 is preferably in direct abutment with the quartz plates 58A, 58B, etc. when the wafers 22A, 22B, etc. are positioned for vapor deposition. The lower surfaces of the wafers 22A, 22B, etc. are preferably spaced about 5 mm from the quartz plates 58A, 58B, etc. to avoid scratching the quartz plates 58A, 58B, etc.

Each of the rods 70–72 may be threadedly connected to a corresponding servomotor 90. The quartz windows 58A, 58B, etc. will normally be lowered a distance sufficient to prevent scratching while the boat 76 moves into position in the deposition chamber 12. The servomotors are used to lower the quartz windows 58A, 58B while the boat is entering or leaving the deposition chamber 12 and to position the quartz windows 58A, 58B, etc. after the boat is in position for deposition. In some applications it may be desired to tilt one or more of the quartz windows 58A, 58B, etc. relative to the boat 76 to control application of heat to the wafers 22A, 22B, etc. Divergence and irregularities in the beam 25 may create "hot" or "cold" spots adjacent the boat 76. Controlling the distance and angular orientation of the quartz windows 58A, 58B, etc. and the wafers 22A, 22B, etc. provides a degree of control over the rate of vapor deposition on the individual wafers 22A, 22B, etc.

Silane, having an absorption cross section of $1.2 \times 10^{-21}$ $cm^2$, is normally transparent to wavelengths in the 193 nm region. However, direct deposition of silicon occurs following photodiassociation of silane by ArF laser irradiation with a power threshold less than 10 megawatts per square centimeter. The focused ArF laser 14 when run at a 100 Hz repetition rate provides 10 ns pulses with a peak power of 40 MW/cm². The reaction volume has a cross sectional area of about 1.5 mm×12 mm. $N_2O$ (Scientific Gas Products USP grade, without further purification) is used as the oxygen donor, since $N_2O$ is far more stable than molecular oxygen in the pressure of silane over a wide range of pressures, temperatures and flow ratios.

The quantum yield for disassociation of $N_2O$ is 1.0 in the 138–210 nm wavelength region and its photo chemistry is well-categorized for single-photon excitation. The photofragment kinetics of $N_2O$ following irradiation by an ArF laser such as the coherent light source 14 are also known. The primary product is reactive excited atomic oxygen according to the equation $$N_2O + hf\ (193\ nm)\ N_2 + O\ (^1D)$$

The reaction kinetics in the vapor deposition apparatus 10 are controlled by competition between quenching and recombination of atomic oxygen, oxidation of silicon hydrids, creation of reactive nitric oxide species and substrate reactions. The vapor deposition apparatus 10 provides enhanced substrate reactions because radiant heat from the halogen light source 66 heats the wafers 22A, 22B, etc. to a proper temperature for vapor deposition and because of the close proximity of the excitation volume of the beam 25 to the wafers 22A, 22B, etc. At the same time, the walls of the vapor deposition chamber 12 are relatively far from the excitation volume. Since Auger analysis and infrared (IR) spectrophotometry show low nitrogen incorporation into the deposited silicon dioxide films, it is believed that only the oxygen species $O_2$ and $O(^1D, ^3P)$ are important in silicon dioxide film growth kinetics.

After the boat 76 and the wafers 22A, 22B, etc. are properly positioned, and the vapor deposition chamber 12 is sealed to be vacuum tight, the valves 36 and 44 are opened to permit the gaseous silicon and oxygen donors to flow into the vapor deposition chamber 12. The silicon and oxygen donors are mixed in the manifold 34; and a vacuum pump 90 connected to the vapor deposition chamber 12 maintains gas flow therethrough at a pressure of about 8 Torr. Suitable flow rates are 70 sccm 5% $SiH_4$ in $N_2$ and 800 sccm $N_2O$. Although the vapor deposition apparatus 10 substantially eliminates unwanted depositions from forming, it may occassionally be necessary to purge the windows 28 and 29 to eliminate opaque deposits from forming thereon.

Radiant heat from the halogen lamp 58 elevates the temperatures of the wafers 22A, 22B, etc. to a proper operating level in approximately 3 seconds with only minimal heat being transfered into the vapor deposition chamber 12. Conventional conductive heating apparatus and methods often require as long as 5 to 6 minutes to properly heat wafers and result in substantial amounts of heat being transfered to the walls of the vapor deposition chamber 12 and to the surfaces of the windows 28 and 29. Since the silicon dioxide vapor tends to deposit on surfaces having temperatures higher than room temperature, rapidly heating the wafers 22A, 22B, etc., with the lamp 66 substantially eliminates unwanted vapor deposition on the vacuum deposition chamber 12 and windows 28 and 29 while substantially enhancing the vapor deposition upon the heated wafers 22A, 22B, etc.

At temperatures below 200° C., deposited silicon dioxide films were milky in appearance and easily scratched. All films formed at temperatures above 200° C. were transparent and uniform in appearance. Films produced at temperatures of 250° C. and above were extremely scratch resistent and adherent. Such films were unaffected by mechanical scribing and adhere more strongly to the wafer 22 than to pressure-sensitive adhesive tape.

In order to demonstrate the efficacy of the vapor deposition apparatus 10, Tables I and II show measured physical and electrical properties of photolytic silicon dioxide films as functions of temperature of the wafer 22 during deposition. Included for comparison are a low pressure chemical vapor deposited film (860° C.; $SiCl_2H_2$ and $N_2O$) and a thermal oxide (1,000° C.; trichloroethylene and $O_2$) film, both of which underwent capacitor fabrication and testing with the photolytic oxides.

Measurements of surface states ($N_{ss}$), flatband voltage ($V_{FB}$), and breakdown voltage ($V_B$) were obtained both from polysilicon gate MOS capacitors ($2\times10^{-4}$ cm² area) and from evaporated Al gate capacitors (0.03 cm area). Polysilicon capacitor fabrication consists of additional high-temperature steps including a densification at 950° C. in $N_2$ for 60 minutes, whereas aluminum capacitors only undergo a 425° C. anneal for 30 minutes (10% $H_2$ 90% $N_2$).

Etch rate and index of refraction measurements were made on both as-deposited and densified films. Etch rates of undensified films decrease with increasing deposition temperature. Etch rate reduction occurs upon densification, becoming comparable to thermal oxide.

Pinhole density measurements were made after a 30-min (10% $H_2$, 90% $N_2$, 425° C.) anneal. Pinhole densities for films deposited at $\geq350°$ C. were less than 1 cm⁻² as measured on a Ga Sonics Pinole Density Monitor.

Breakdown voltages were measured on a Tektronix Model 117 curve tracer using two techniques: (1) 20 V per second increase until breakdown and (2) 2 V/s increase with a 1.0-minute dwell every 10 V. Separate scans were made using ac and dc applied voltages.

Refractive index and thickness measurements were made with an ellipsometer. Thickness measurements were verified on a Dektak profilometer and with a Nanospec film depth computer. These measurements were taken before and after densification except for the 250° and 300° C. deposits. Variation in refractive index due to densification was 1%, and thickness reductions of 10–15% were seen in agreement with previous work. The index of refraction for the photolytic oxides closely agrees with the thermal oxide.

The $N_{ss}$ values for phtolytic oxides were 10 to 100 times larger than for LPCVD and thermal oxides. These differences may be due to the fact that the photolytic oxides were grown on wafers handled in an uncontrolled laboratory environment, while the LPCVD and thermal oxides were grown on wafers handled in an uncontrolled laboratory environment, while the LPCVD and thermal oxides were grown in a clean room envionment. Sputter-profiled Auger and secondary ion mass spectroscopy (SIMS) showed evidence of hydrocarbond throughout the films probably due to oil backstreaming from the fore pump in our laser photodeposition setup.

Deposition rate of $SiO_2$ films is independent of substrate temperature between 20° and 600° C. and directly proporational to gas pressure and laser intensity. During profile measurements of oxide thickness, low-temperature $SiO_2$ films (<200° C.) were damaged by the stylus as they were mechanically soft.

Since the reactant gas mixture used was 89% $N_2O$ 10% $N_2$, and 1% $SiH_4$, nitrogen incorporation in the $SiO_2$ films was a concern. By using IR spectrophotometry a shift of less than 20 $cm^{-1}$ of the 1080 $cm^{-1}$ Si-O absorption peak toward 850 $cm^{-1}$ Si-N peak was measured. This corresponds to less than 5% $Si_3N_4$ content in the $SiO_2$ films. In addition, sputtering Auger analysis was used to analyze incorporation of nitrogen in the films and showed 2-4% nitrogen content. Hence there is low nitrogen incorporation in the films, the bonding of which is unknown. Index of refraction values in Table I also show that the films are neither silicon rich nor nitride rich.

TABLE I

Properties of photodeposited $SiO_2$ films.

| Temp. °C.[a] | Oxide depth(a) P—Si | Oxide depth(a) Al | $N_{ss}$ P—Si | $(10^{11} cm^{-2})$ Al | V P—Si | (V) Al |
|---|---|---|---|---|---|---|
| 500 | 2009 | 1440 | 8.2 | 1.3 | −8.0 | −0.3 |
| 450 | 1670 | 1460 | 8.6 | 1.5 | −8.3 | −0.4 |
| 400 | 1930 | 1630 | 7.4 | 2.6 | −8.3 | −1.3 |
| 350 | 1700 | — | 10 | — | −9.8 | — |
| 300 | 1800 | 1300 | 12 | 4.5 | −11.8 | −2.1 |
| 250 | 1940 | — | 9.5 | — | −10.4 | — |
| Thermal oxide | 978 | — | 0.3 | — | −1.3 | — |
| LPCVD | 1800 | — | 1.9 | — | 0.1 | — |

TABLE II

Properties of photodeposited SiO films.

| Temp. °C. | as-depos. etch rate (A/s)[b] | Densified etch rate (A/s)[b] | Refractive index | Breakdown voltage V (MV/cm) | Pinhole density (cm) |
|---|---|---|---|---|---|
| 500 | 48 | 16 | 1.452 | 8.8 | c |
| 450 | 57 | 11 | 1.464 | 9.0 | c |
| 400 | 67 | 20 | 1.447 | 7.9 | c |
| 350 | 83 | 14 | 1.457 | 8.9 | 1 |
| 300 | 92 | — | 1.473 | 9.4 | 4-6 |
| 250 | 102 | — | 1.476 | 5.2 | 16 |
| Thermal oxide | 14 | — | 1.452 | 8 | |
| LPCVD | 41 | — | 1.440 | 8.2 | |

[a]Substrate temperature during photolytic oxide deposition
[b]5 to 1 buffered HF.
[c]None observed.

The apparatus and method of the present invention have significant advantages over prior vapor deposition techniques. This invention requires a relatively short cycle time due to the heating of the substrates 22 in just a few seconds and due to the high deposition rate of 1,000 A per minute. The substrates 22 need to be at the deposition temperature of 300-450 degrees Celsius for only about 5-10 minutes, depending on the required thickness of the material to be deposited. LPCVD AND PECVD techniques require that the substrates sit at temperatures for approximately 120 minutes.

Since the invention provides vapor deposition at relatively low temperatures, the walls of the vapor deposition chamber are cold. Reactants are generated only in the path of the laser beam 25, which is spaced apart from the chamber walls. Therefore, only minimal deposition occurs on the surfaces of the vapor deposition chamber.

Unlike the PECVD technique, which produces photons at energies greater than 10 eV in all directions, the coherent light source used in the invention produces photons of energies less than 6.4 eV directed so as to not impinge upon the surfaces of the substrates 22. No high energy photons are incident upon the substrates 22. Therefore, in the vapor deposition process of the invention the substrates 22 experience substantially no radiation damage.

The laser enhanced vapor deposition technique of the present invention is simplier than the LPCVD or PECVD techniques. Deposition rate is independent of the temperature of the substrate and is linear with respect to the photon flux in the coherent light beam 25.

Because of the relatively low temperature of the vapor deposition chamber, the system lends itself to automated substrate handling schemes.

The apparatus and method of the present invention may be used for depositing many different types of materials, such as silicon nitride, molybdemum, turgsten, tantalum, chromium, and aluminum.

Since the laser beam 25 does not impinge upon the surfaces of the substrates 22 and since vapor deposition can be done at 200 degrees Celcius, LECVD can be used to deposit films on temperature-sensitive structures such as organic photoresists.

What is claimed is:

1. A system for chemical vapor deposition of a substance on substrates in a vapor deposition chamber without deposition of vapor on the chamber walls, comprising:

means for producing substantially coherent light;

means for positioning at last one of the substrates in the vapor deposition chamber;

means displaced from the deposition chamber for producing heat on the substrate in a substantially uniform and localized relationship to raise the temperature of the substrate to a particular temperature before the deposition of the substance on the substrate for facilitating the deposition of the substance upon the substrate;

means for supplying to the deposition chamber donors of a substance to be deposited;

means for directing the substantially coherent light from the light means in a direction substantially parallel, and contiguous, to the substrate to obtain an interaction of the donors in response to the substantially coherent light and to obtain a deposition of the substance upon the substrate; and means for providing for an adjustment in the orientation of the substrates relative to the beam of substantially coherent light to optimize the deposition of the substance on the substrates.

2. The system of claim 1, wherein the heat-producing means produces infrared radiation and wherein the adjusting means provides individual adjustments at different positions on each of the substrates relative to the substantially coherent beam at such individual positions.

3. The system of claim 1, wherein the heat-producing means includes a lamp and a reflector proximate the lamp for producing a beam of light of substantially constant intensity and directing the beam of substantially constant intensity light toward the substrates in a direction substantially perpendicular to the substrates.

4. The system of claim 1, wherein the adjusting means includes:
    a bellows;

means supported by the bellows for isolating the heat-producing means from the donors; and means for adjusting the bellows relative to the substantially coherent light to control the orientation between the substantially coherent light and the substrate.

5. The system of claim 4, further including servo means for adjusting the bellows.

6. The system of claim 1, including, means for transporting the substrates into the deposition chamber.

7. The system of claim 5, wherein the transporting means includes a boat having a plurality of passages each defining steps and a shoulder between the steps for supporting the substrates in the passages on the shoulders between the steps.

8. The system of claim 7 further including:
the heat-providing means providing infrared radiation and being disposed in displaced relationship to the deposition chamber;
a plurality of window means for transmitting the infrared radiation to each stepped passage to heat the substrate mounted in the passage;
reflector means displaced from the deposition chamber for applying the infrared radiation to the window means in the plurality in a beam substantially perpendicular to the substrate;
the heat-providing means including a plurality of lamps; and
a plurality of bellows means each supporting a separate one of the heat-providing means and the shoulders and connected to an associated one of the window means for separately adjusting the relative distances and the angular orientations of the associated window means relative to the beam of substantially coherent light.

9. The system of claim 8 further including servo means for adjusting the bellows means in the plurality independently of one another.

10. A process for chemical vapor deposition of a substance on a substrate in a vapor deposition chamber without deposition of the substance on walls of the chamber, comprising the steps of:
positioning the substrate adjacent a window in the vapor deposition chamber;
directing localized and substantially uniform heat upon the substrate through the window to heat the substrate substantially uniformly to a particular temperature for facilitating the deposition of the substance substantially uniformly on the substrate;
supplying donors of the substance to be deposited upon the substrate to obtain an interaction of the donors for the production of the substance in accordance with the energy imparted to the donors;
directing a beam of substantially coherent light in a direction substantially parallel, and contiguous, to the substrate to impart energy to the donors for inducing deposition of the substance on the substrate; and
adjusting the orientation of the substrate relative to the beam of substantially coherent light moving past the substrate to optimize the deposition of the substance on the substrate.

11. The process of claim 10, further including the steps of:
positioning the substrate in the deposition chamber adjacent the window; and
adjusting the orientation of the window relative to the substantially coherent beam of light at individual positions around the periphery of the window.

12. A method as set forth in claim 10 wherein the distance between the beam of substantially coherent light and the substrate is adjusted to be less than one millimeter (1 mm).

13. A method as set forth in claim 12 wherein the localized heat is applied substantially uniformly to the substrate from a position outside of the chamber.

14. A method as set forth in claim 13 wherein the localized heat is directed in a beam toward the substrate in a direction substantially perpendicular to the substrate and wherein the localized heat is obtained from ultraviolet radiation.

15. In combination for providing for the deposition of a substance on a substrate,
an enclosed chamber;
means in the enclosed chamber for supporting the substrate;
means for directing a beam of substantially coherent light through the enclosed chamber in a direction substantially parallel, and contiguous, to the substrate;
means for directing, into the chamber and toward the substrate, gases having properties of reacting at high energy levels provided by the beam of substantially coherent light to produce the substance;
means for directing to the substrate heat substantially uniformly distributed throughout the substrate and localized to affect the temperature of substantially only the substrate to facilitate the deposition of the substance on the substrate; and
means for orienting the supporting means relative to the beam of substantially coherent light to optimize the reactions at the high energy levels.

16. A combination as set forth in claim 15, including, the heat-directing means being disposed to direct the heat in a direction substantially perpendicular to the direction of the beam of substantially coherent light.

17. A combination as set forth in claim 16, including the orienting means including a plurality of adjustable members cooperating with the supporting means at displaced positions on the supporting means for individually adjusting the orientation of the supporting means relative to the window at such displaced positions.

18. A combination as set forth in claim 17, including, the orienting means including a bellows for adjusting the orientation of the supporting means relative to the beam of substantially coherent light.

19. A combination as set forth in claim 15, including, the supporting means defining a window for the passage of the localized heat to the substrate and for the isolation of the heat-producing means from the gases in the enclosed chamber and for the support of the substrate,
the orienting means including a plurality of members for individually adjusting the orientation of the window relative to the beam of substantially coherent light at different positions around the window.

20. A combination as set forth in claim 15, including, the heat-directing means including means for producing ultraviolet light; and
means defining a window for the passage of the localized heat into the chamber and to the substrate for the isolation of the heat-producing means from the gases in the enclosed chamber.

21. A combination as set forth in claim 20, including, the supporting means including a window disposed in the enclosed chamber at a position for passing the beam of substantially coherent light into the chamber and to the substrate.

22. A combination as set forth in claim 15 wherein the beam of substantially coherent light is adjusted by the orienting means to be separated from the subtrate by a distance in the order of one millimeter (1 mm).

23. A combination as set forth in claim 20 wherein the beam of substantially coherent light is adjusted by the orienting means to be separated from the substrate by a distance in the order of three tenths of a millimeter (0.3 mm).

24. A method of depositing a substance on a substrate, including the steps of:
disposing the substrate in an enclosed chamber;
introducing into the chamber gases having properties of reacting with one another at high energy levels to produce the substance;
directing into the chamber a beam of substantially coherent light in a direction and at a position to pass through the chamber in contiguous relationship to the substrate and at positions substantially equidistant from the substrate for the production of energy levels sufficient to obtain the reaction of the gases for producing the substance;
directing, into the chamber and to the substrate, heat substantially uniformly distributed over the substrate and localized to affect substantially only the substrate for facilitating the deposition of the substance on the substrate; and
orienting the substrate relative to the beam of substantially coherent light to optimize the reaction of the gases for producing the substrate.

25. A method as set forth in claim 24, including, adjusting the distance through which the localized heat travels to reach the substrate.

26. A method as set forth in claim 24 wherein the orientation of the substrate relative to the beam of substantially coherent light is individually provided at different positions around the substrate.

27. A method as set forth in claim 24 wherein the heat-producing means is isolated from the enclosed chamber by a window and the localized heat is directed through the window.

28. A method as set forth in claim 24 wherein the substrate is oriented relative to the beam of substantially coherent light so that the distance between the beam of substantially coherent light and the substrate is in the order of one millimeter (1 mm).

29. A method as set forth in claim 25 wherein the heat is directed in a beam to the substrate and the substrate is oriented relative to the beam of substantially coherent light so that the distance between the beam of substantially coherent light and the substrate is in the order of three tenths of a millimeter (0.3 mm).

30. A system for laser induced chemical vapor deposition of a substance on a substrate in a vapor deposition chamber without deposition of vapor on the chamber walls comprising:
means for positioning the substrate in the vapor deposition chamber;
means, isolated from the deposition chamber, for producing infrared radiation to heat the wafer to a predetermined temperature before vapor deposition;
window means for transmitting the infrared radiation to the substrate;
means for concentrating the infrared radiation upon the window means;
means for providing a controlled application of the infrared radiation through the window means;
means for supplying to the deposition chamber donors of a substance to be deposited;
means for interacting the donors with coherent light to induce deposition of the substance upon the substrate;
the producing means including a halogen lamp;
the application means including:
a reflector proximate the lamp for producing a beam of infrared radiation of substantially constant intensity;
a bellows having an end connected to the window means; and
means for adjusting the bellows to control the distance and angular orientation of the window means relative to the beam of substantially coherent light.

31. The system of claim 30, further including servo means for adjusting the bellows.

32. The system of claim 31, wherein the transporting means includes a boat having a plurality of stepped diameter passages therethrough for supporting a generally circular substrate on a shoulder between the steps.

33. A system for laser induced chemical vapor deposition of a substance on a plurality of substrates in a vapor deposition chamber without deposition of vapor on the chamber walls, comprising:
means for positioning the substrates in the vapor deposition chamber;
means, isolated from the deposition chamber, for producing infrared radiation to heat the substrates to a predetermined temperature before vapor deposition;
window means for transmitting the infrared radiation to the substrates;
means for applying a localized and substantially uniform passage of the infrared radiation through the window means to the substrates;
means for supplying to the deposition chamber donors of a substance to be deposited;
means for interacting the donors with substantially coherent light to induce deposition of the substance upon the substrates;
the positioning means including means for transporting the substrates into the deposition chamber; and
a plurality of bellows means connected to the window means for adjusting the orientations of the substrates relative to the coherent light to optimize the deposition of the substance on the substrates.

34. The system of claim 33 further including servo means for individually adjusting the bellows means in the plurality independently of one another.

* * * * *